US010896271B1

(12) United States Patent
Baudart et al.

(10) Patent No.: US 10,896,271 B1
(45) Date of Patent: Jan. 19, 2021

(54) OPTIMIZED DEVELOPMENT OF ELECTRO-MECHANICAL DEVICES

(71) Applicant: MIRMEX MOTOR SA, Mont-Saint-Guibert (BE)

(72) Inventors: François Baudart, Brussels (BE); Bruno Dehez, Liernu (BE); Cedric Van Rossum, Brussels (BE)

(73) Assignee: MIRMEX MOTOR SA, Mont-Saint-Guibert (BE)

( * ) Notice: Subject to any disclaimer, the term of this patent is extended or adjusted under 35 U.S.C. 154(b) by 0 days.

(21) Appl. No.: 16/836,640

(22) Filed: Mar. 31, 2020

(51) Int. Cl.
*G06F 30/20* (2020.01)
*H02K 3/42* (2006.01)
*H02K 3/26* (2006.01)

(52) U.S. Cl.
CPC .............. *G06F 30/20* (2020.01); *H02K 3/26* (2013.01); *H02K 3/42* (2013.01); *H02K 2203/03* (2013.01)

(58) Field of Classification Search
USPC ........................................................ 716/137
See application file for complete search history.

(56) References Cited

U.S. PATENT DOCUMENTS

| 2003/0151465 A1* | 8/2003 | Wood | H03B 5/1852 331/107 SL |
| 2008/0058149 A1* | 3/2008 | Yang | B60K 6/40 475/230 |
| 2011/0298310 A1* | 12/2011 | Ross | H02K 41/06 310/20 |
| 2019/0260252 A1 | 8/2019 | Lambourne et al. | |
| 2020/0005988 A1* | 1/2020 | Iyer | A61N 1/3787 |

FOREIGN PATENT DOCUMENTS

| EP | 0940749 A2 | 9/1999 |
| EP | 1590871 A2 | 11/2005 |
| EP | 3297132 A1 | 3/2018 |
| WO | 2014/207174 A2 | 12/2014 |

(Continued)

OTHER PUBLICATIONS

Dehez, B., et al., "Analysis of BLDC motor with zigzag and rhombic winding," International Conference on Electrical Machines, Sep. 2010, 5 pages.

(Continued)

*Primary Examiner* — Mohammed Alam
(74) *Attorney, Agent, or Firm* — Christensen O'Connor Johnson Kindness PLLC

(57) ABSTRACT

A method for producing a winding assembly for an electro-mechanical device, wherein the winding assembly comprises a circuit board with conductor tracks, wherein the winding assembly preferably comprises a substantial number of optimizable design parameters, the method comprising: optimizing, in a computerized optimization tool, the design of the winding assembly; manufacturing the circuit board with the winding conductor tracks according to the optimized design of the winding assembly; forming the winding assembly of the electro-mechanical device with the manufactured circuit board. The design of the winding assembly is optimized depending on at least one of eddy current losses, hysteresis losses, aerodynamical losses and mechanical losses.

22 Claims, 5 Drawing Sheets

(56) References Cited

FOREIGN PATENT DOCUMENTS

WO 2016/110549 A1 7/2016

OTHER PUBLICATIONS

Dehez, B., et al., "Analysis and Comparison of Classical and Flex-PCB Slotless Windings in BLDC Motors," International Conference on Electrical Machines and Systems, Oct. 2012, 6 pages.

Dehez, B., et al., "Theoretical and experimental investigation of flex-PCB airgap windings in slotless BLDC machines," IEEE Transactions on Industry Applications 50(5), Sep. 2014, 8 pages.

Baudart, F., et al., "Shape optimization of flexible PCB slotless windings in BLDC machines," International Conference on Electrical Machines and Systems, Oct. 2013, 6 pages.

Dehez, B. et al. "Analysis of a new topology of flexible PCB winding for slotless BLDC machines," International Conference on Electrical Machines, Sep. 2014, 7 pages.

Dehez, B., et al., "Comparison of FPCB windings of BLDC machines with paralelly and radially magnetized rotor poles," International Conference on Electrical Machines and Systems, Oct. 2014, 7 pages.

Baudart, F., et al., "FlexPCB windings, the way towards very high performance coreless BLDC motors," Actuator 2016, Aug. 2015, 4 pages.

François, G., et al., "Numerical Investigation of Eddy Current Losses in Airgap PCB Windings of Slotless BLDC Motors," International Conference on Electrical Machines and Systems, Oct. 2018, 7 pages.

Imstepf, D., et al. "Potential of Flex-PCB Winding in Coreless Tubular Permanent Magnet Synchronous Machines," International Conference on Electrical Machines and Systems, Nov. 2016, 7 pages.

Dehez, B., et al., "Analysis of a new topology of flexible PCB winding for slotless BLDC machines," International Electric Machines and Drives Conference , May 2017, 8 pages.

De Gréef, C., "Design and optimization of radial flux Brushless DC motors with flexible PCB windings," Masters Thesis Université catholique de Louvain, 2017, Abstract, 1 page.

Liu, Y., et al., "Design Considerations for MHz PCB Winding Magnetic Components," 2019 IEEE 4th International Future Energy Electronics Conference (IFEEC), Nov. 2019, 8 pages.

François, G., et al., "Analytical estimation of eddy current losses in PCB winding for the optimal sizing of PM slotless motor," 2019 IEEE International Electric Machines & Drives Conference (IEMDC), May 2019, 8 pages.

* cited by examiner

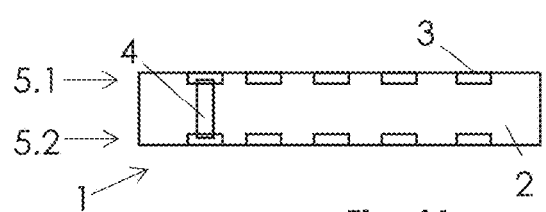 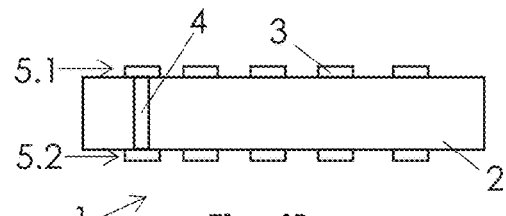
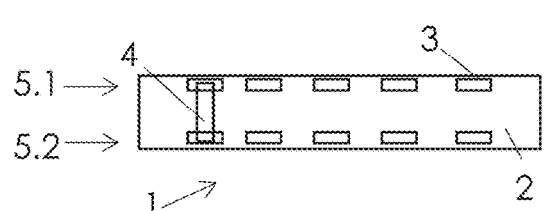 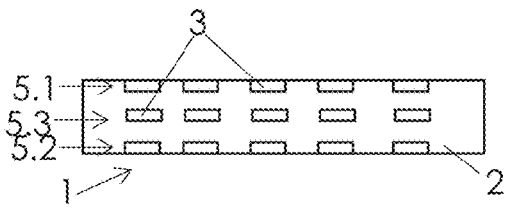
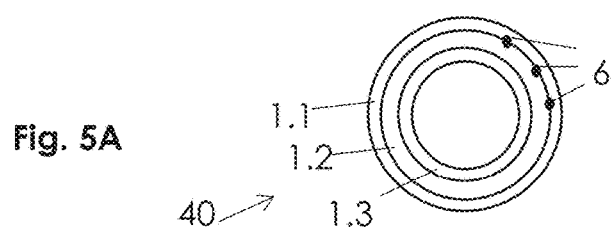
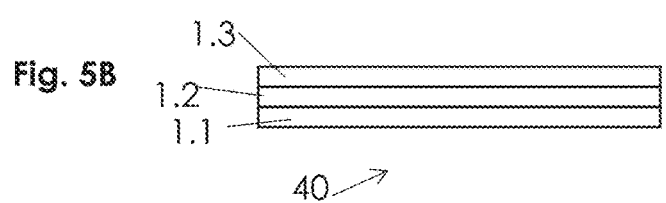
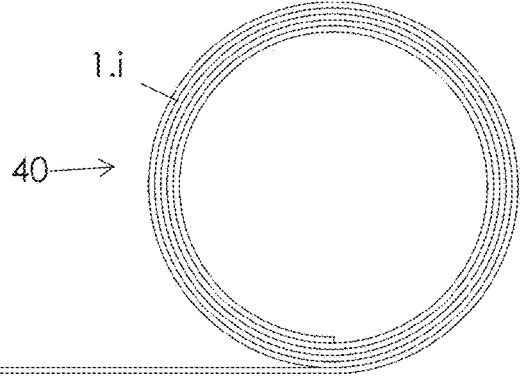

US 10,896,271 B1

OPTIMIZED DEVELOPMENT OF ELECTRO-MECHANICAL DEVICES

TECHNICAL FIELD

Embodiments of the present disclosure relate to a method for developing an electro-mechanical device, e.g., a motor or a generator, a computer program for optimizing the design of the electro-mechanical device, and a computerized optimization device for optimizing the design of the electro-mechanical device. In some of these embodiments, the electro-mechanical device comprises a winding assembly with a substantial number of optimizable design parameters.

BACKGROUND

The development of the design of an electric motor is complex and cumbersome. Only for very high-volume applications, can a new motor design be developed. Motors for applications with lower manufacturing numbers have today no other choice than to reuse existing designs that can only be partially adapted to a specific application. In addition, the development of the design of an electric motor is often not only based on the characteristics of the motor itself like losses, speed and torque, but also on the requirement to support an efficient and affordable production.

In particular, the winding assembly of a motor is today rather designed for easy manufacturing by traditional wire winding machines than for creating an efficient motor. Consequently, such actual winding assemblies have in reality a limited number of design parameters. Therefore, most electric motors, specifically those used in small volume applications, are not optimized for their application due to the burden and costs of the development of an individualized motor, and of an individualized winding assembly in particular. Especially in the field of micro motors that have demanding constraints on power, size and weight, the classic motor technology limits the possibilities of optimal application.

A motor fully optimized for an application can have benefits in cascade for the application. For example, a lighter motor will require a lighter mechanical structure to support it, a more efficient motor will need a smaller battery, a motor with a lower operating temperature will increase the lifetime of the application, etc.

Computerized simulations or models are used when developing new motors. However, in most applications, the computerized simulations and models are used to check the final performance of the motor, but not for optimizing the motor design in detail.

A technology known since the eighties proposes to print the conductors of the winding assembly on a printed circuit board (PCB) and create the winding assembly with the PCB. A special technology uses flexible PCBs, which are then rolled to become the stator winding assembly of a brushless motor. The PCB enables substantially more flexibility in developing the design of the winding assembly as the winding assembly must no longer consider the constraints of traditional winding manufacturing machines. It was thus suggested to optimize certain criteria of the winding assembly by a computerized optimization tool.

EP3014744 suggests optimizing the position of the conductor tracks on the PCB for a certain fixed conductor track topology to obtain the best winding assembly for a certain application. The optimization uses an optimization function like the motor constant depending on the motor torque and the resistance of the conductors of the winding assembly (also called the Joules losses). Similar disclosures can be found in EP1590871 and EP0949749.

EP3297132 discloses a motor application for high rotation speeds. To avoid Eddy currents in the conductors of the winding assembly, it is suggested to split the tracks constituting a current path into smaller parallel conductor tracks. This however creates circulating currents due to the different induced voltages in the different parallel tracks. Therefore, it is suggested to run an optimization to find the best positions for connections between the parallel conductor tracks for reducing the circulating currents.

The optimization algorithms in the state of the art show an optimization for special applications, but could often not be realized, when using the suggested computerized optimization for the development of other motor applications. In addition, the achieved improvements were still not good enough to substitute the classical motor designs with classic wire coils and did not yet satisfy the requirements of high-end micro motors.

The same problems arise in the development of generators or combined motor-generators.

SUMMARY

It is an object to provide a method and an optimization tool for improving the development of an electro-mechanical device, for example to reduce the time for its development, to better adapt the electro-mechanical device to a plurality of possible applications, including low volume applications, and/or to further improve the electro-mechanical devices.

One of the objects is solved, for example, by a method for producing a circuit board for forming a winding assembly for an electro-mechanical device. In an embodiment, the circuit board comprises winding conductor tracks. Example methods comprise the following steps: optimizing, in a computerized optimization tool, the design of the winding assembly; and manufacturing the circuit board with the winding conductor tracks according to the optimized design of the winding assembly. In an embodiment, the method is characterized by one or a combination of two or more of the subsequently described embodiments.

One of the objects is solved, for example, by a method for producing a winding assembly for an electro-mechanical device. In an embodiment, the winding assembly comprises a circuit board with winding conductor tracks. Examples of the method comprise the following steps: optimizing, in a computerized optimization tool, the design of the winding assembly; manufacturing the circuit board with the winding conductor tracks according to the optimized design of the winding assembly; and forming the winding assembly of the electro-mechanical device with the manufactured circuit board. In some embodiments, the method is characterized by one or a combination of two or more of the subsequently described embodiments.

One of the objects is solved, for example, by a method for producing an electro-mechanical device with a winding assembly. In an embodiment, the winding assembly comprises a circuit board with winding conductor tracks. Examples of the method comprise the following steps: optimizing, in a computerized optimization tool, the design of the electro-mechanical device; manufacturing the circuit board with the winding conductor tracks according to the optimized design of the electro-mechanical device; forming the winding assembly of the electro-mechanical device with the manufactured circuit board; and assembling the electro-mechanical device with the formed winding assembly according to the optimized design of the electro-mechanical device. In some embodiments, the method is characterized by one or a combination of two or more of the subsequently described embodiments.

One of the objects is solved, for example, by a winding assembly or an electro-mechanical device produced according to one or more of the previously described methods.

One of the objects is solved, for example, by a winding assembly formed by a circuit board with winding conductor tracks. In some embodiments, the winding assembly is characterized by one or a combination of two or more of the subsequently described embodiments and/or by being manufactured by one or more of the above-mentioned methods.

One of the objects is solved, for example, by a circuit board with winding conductor tracks for a winding assembly of an electro-mechanical device. In some embodiments, the circuit board is characterized by one or a combination of two or more of the subsequently described embodiments or by being manufactured by one or more of the above-mentioned methods.

One of the objects is solved, for example, by an electro-mechanical device comprising a rotor, a stator, a magnetic device and a winding assembly, wherein the winding assembly is formed by a circuit board with winding conductor tracks. In some embodiments, the electro-mechanical device is characterized by one or a combination of two or more of the subsequently described embodiments.

One of the objects is solved, for example, by a computerized optimization tool for developing an electro-mechanical device with a winding assembly or a winding assembly for an electro-mechanical device, wherein the winding assembly is formed by a circuit board with winding conductor tracks, the computerized optimization tool is configured to optimize the design of the winding assembly for the electro-mechanical device. In some embodiments, the computerized optimization tool is characterized by one or a combination of two or more of the subsequently described embodiments.

One of the objects is solved, for example, by a computer program or instructions for developing an electro-mechanical device with a winding assembly or a winding assembly for an electro-mechanical device, wherein the winding assembly is formed by a circuit board with winding conductor tracks, the computer program comprises instructions configured to optimize the design of the winding assembly for the electro-mechanical device or to optimize the design of the electro-mechanical device, when executed on a processor. In some embodiments, the computer program or instructions is characterized by one or a combination of two or more of the subsequently described embodiments.

One of the objects is solved, for example, by a computerized conversion tool or a computer program, instructions, etc., for converting an optimized design of a winding assembly of an electro-mechanical device into a design of a circuit board. The design of the circuit board includes preferably materials, positions, and/or dimensions of (i) the conductor tracks, (ii) the connectors connecting the conductor tracks on different conductor layers of the circuit board and optionally (iii) an adjacent substrate. This conversion allows to automate the development and manufacturing of the winding assembly almost completely and significantly reduces the time for development of new electro-mechanical devices.

Subsequently embodiments referenced above or others will discussed below.

In one embodiment, the design of the winding assembly is optimized in the computerized optimization tool based on an optimization function depending on at least one of eddy current losses, hysteresis losses, aerodynamical losses and mechanical losses.

In one embodiment, the computerized optimization tool is configured to optimize the winding assembly based on a device model which considers at least one of eddy current losses outside of the winding conductor tracks, hysteresis losses, aerodynamical losses and mechanical losses.

The state of the art had never considered those losses in the optimization process. However, for many applications the consideration of those losses is very important to improve the performance of the winding assembly or the electro-mechanical device. By considering those losses in the optimization tool, significant performance improvements were observed in the developed electro-mechanical devices.

In one embodiment, the optimization function or the device model depends on two or more of Joules losses, unbalanced current losses, the eddy current losses outside of the winding conductor tracks, eddy current losses in the winding conductor tracks, the hysteresis losses, the aerodynamical losses and the mechanical losses, in some embodiments on at least three of them, and in some other embodiments on all of them. This enables a more complete evaluation of the losses, which enable in turn the optimization tool to perform the optimization based on parameters that better stick to the reality of physics. Many earlier simulations did only consider one type of loss like the Joules losses or the unbalanced losses to optimize a single feature of the winding assembly based on the selected type of losses. This substantially limited the improvements resulting from the optimization, especially when mutually exclusive design decisions were involved. Furthermore, this reduces the flexibility of the tool to be used for different applications. Few state-of-the-art documents use two specific types of losses to find a trade-off between two types of losses for a specific problematic in specific operation conditions. The general consideration of 2 or 3 or more types of losses allows the optimization tool to be more flexible for all operation conditions and for all types of problems.

In one embodiment, the computerized optimization tool is configured to optimize the design of the winding assembly based on at least one of a directional or dimensional parameter of a cross-section of the conductor tracks, the number and/or way of conductor tracks connected in parallel or in series, a coordinate of an interlayer connection, preferably using a via, thickness of one or more of the conductor tracks, a dimension of the winding assembly, the number of superpositions of the circuit board, a directional or dimensional parameter of a cross-section of a substrate of the circuit board, materials of the circuit board or the substrate, the connection of the coil assemblies, the number of coil assemblies, the number of winding terminals and the position of the winding terminals. The optimization algorithms of the state of the art did only optimize the curvature of the conductor tracks and some limited parameters of the conductor track design on the circuit board to find the best design for the winding assembly. It was however found out that the consideration of one or more of the above-mentioned parameters significantly improve the outcome of the optimization result. The directional or dimensional parameter of the cross-sections of the conductor tracks have an important influence on Eddy current losses and Joules losses, in particular the thickness and/or width of the conductor tracks. The number of conductor tracks connected in parallel have an important influence on the Eddy current losses. The dimension of the winding assembly, e.g. its thickness, directions and dimensions of a cross-section of an adjacent substrate, and/or the superpositions of the circuit board have also an important impact on the performance of the electro-mechanical device to develop. The thickness of the substrate of the circuit board, the connection of the coil assemblies, the number of coil assemblies, the number of winding terminals and the position of the winding terminals were found also to have an important influence on the performance of the optimized device. So do the materials of these elements.

In one embodiment, the method comprises the step of converting, in a computerized conversion tool, the optimized design of the winding assembly into a design of the circuit board including positions and dimensions of the conductor tracks and including positions and dimensions of connectors connecting the conductor tracks on different conductor layers of the circuit board, wherein the circuit board with conductor tracks for the optimized design of the winding assembly is manufactured based on the converted design of the circuit board. In some embodiments, the method comprises the following steps: converting, in the computerized conversion tool, the design of the circuit board into at least one file readable by at least one manufacturing machine and sending the at least one file to the at least one manufacturing machine, wherein the circuit board with the conductor tracks for the optimized design of the winding assembly is manufactured with the at least one manufacturing machine based on the at least one file. In some embodiments, the at least one file comprises at least one first file defining the positions and dimensions of the conductor tracks in each conductor layer of the circuit board (such as gerber, point cloud, GCode, machining instructions, 3D rendering files or similar) optionally complemented by one second file including the position and dimensions of the connectors between conductor tracks from different conductor layers. In one embodiment, the at least one first file and the one second file can be integrated into one single file. The at least one file and/or the second file can further comprise positions, dimensions, and connections information of an adjacent substrate or an adjacent sleeve. This conversion allows to automate the development and manufacturing of the winding assembly almost completely and significantly reduces the time for development of new electro-mechanical devices.

In one embodiment, the winding assembly comprises a determined superposition of a number of stackable circuit board layers, wherein each circuit board layer corresponds to a different area of the circuit board, wherein the optimized design of the winding assembly is converted into the design of the circuit board so that the distance between conductor tracks in different areas are adapted based on the circuit board layer of this area. The adaption of the distance between the conductor tracks depending on the circuit board layer has many very nice applications. By moving this step out of the optimization algorithm, the optimization and the conversion will become much easier without losing its desired effect.

In one embodiment, the circuit board is a flexible circuit board, wherein the winding assembly is formed by rolling the manufactured somewhat flexible circuit board so that different areas of the flexible circuit board are superposed in the different circuit board layers with different radiuses, wherein the optimized design of the winding assembly is converted into the design of the circuit board so that the distance between conductor tracks in different areas are adapted to the radius corresponding to the radius of the circuit board layer of this area so that conductor tracks which are angularly positioned in the optimized design of the winding assembly are also positioned in the winding assembly created by the rolled circuit board. This enables to guarantee in the rolled flexible circuit board the perfect positioning of the conductor tracks and thus to keep the performance modelled in the optimization tool.

In one embodiment, the optimized design of the winding assembly is converted into the design of the circuit board so that the distance between conductor tracks in different areas are adapted based on the circuit board layer so that the conductor tracks follow a defined misalignment in a magnetic direction. This allows to introduce later certain misalignments which could have a filtering purpose or an improvement of the function of the device.

In one embodiment, the computerized optimization tool comprises a device model of the electro-mechanical device, which models the mechanical behaviour and the electromagnetical behaviour of the electro-mechanical device. The device model in some embodiments is defined by a set of model parameters in an allowed model parameter space.

In one embodiment, the computerized optimization tool is configured to receive at least one operation parameter of the electro-mechanical device, wherein the design of the winding assembly is optimized in the computerized optimization tool by repeating different optimization cycles with different value sets for the set of model parameters, wherein each optimization cycle performs the following steps with a value set for the set of model parameters of the respective optimization cycle: determining the mechanical behaviour and the electromagnetical behaviour of the electro-mechanical device based on the device model for the at least one operation parameter and for the value set of the actual optimization cycle; calculating a result of an optimization function based on the determined mechanical behaviour and/or the electromechanical behaviour; and comparing the result of the optimization function with at least one result of the optimization function of at least one previous optimization cycle.

In one embodiment, the computerized optimization tool is configurable so that more than 50% of the model parameters of the set of model parameters of the machine model are configurable model parameters which can be selected among a constraint state and a free state, wherein the optimization of each configurable model parameter configured in the constraint state is limited to a sub model parameter space of the allowed model parameter space and the optimization of each configurable model parameter configured in the free state is freely optimizable in the allowed model parameter space, and/or the computerized optimization tool is configurable so that the optimization function can be selected among different optimization functions. This configurability makes the optimization tool very flexible so that it can be used for any potential application. In one application, the size need to be fixed and the torque needs to be maximised for a given total amount of losses, while in another application, the total amount of losses must be reduced for a given speed and torque and other parameters are constraint. This configurability is an important feature for quickly developing devices for any application, as the optimization tool must not be adapted for each application.

In one embodiment, the computerized optimization tool is configured to optimize the electro-mechanical device based on a combined optimization of the winding assembly and the design of the remaining electro-mechanical device. Classical optimization algorithms could only optimize a limited number of parameters of the winding assembly alone. It was found out that the interactions between the other parts of the device, e.g. the rotor, the stator, the magnetic assembly and the gap, and the winding assembly are crucial and that a combined optimization of parameters of the winding assembly and of other parts of the electro-mechanical device enables a new level of performance for electro-mechanical devices. This illustrates the benefit of using the combination of a comprehensive optimization with a winding assembly that comprises a high number of optimizable parameters, which give much more freedom to the electro-mechanical developer. This showed in particular beneficial for rotating electro-mechanical devices.

In one embodiment, the optimization of the design of the remaining electro-mechanical device comprises the optimization of the design of at least one of a magnetic assembly of the electro-mechanical device, of a gap between a stator and a rotor of the electro-mechanical device, of the rotor and of the stator, for example the design of the remaining electro-mechanical device comprises at least one of a material and/or at least one dimension of the stator yoke, a material and/or at least one dimension of the permanent magnet(s) in the magnetic assembly, a number of pole pairs in the magnetic assembly, a material and/or at least one dimension of the rotor yoke, the thickness of the gap.

In one embodiment, the computerized optimization tool is configured to optimize the electro-mechanical device/the winding assembly based on an optimization of at least one material used for the electro-mechanical device/winding assembly. It was shown that taking also the material(s) of the electro-mechanical device into account, significantly improves the optimization result. In some embodiments, the at least one material used for the electro-mechanical device is a material of one or more of a magnetic assembly of the electro-mechanical device, of the winding assembly, of the rotor and of the stator. The material of the magnetic assembly could be the material of the magnets or the material of the support material holding the magnets. The material of the winding assembly could be the material of the substrate and/or the conductor tracks of the circuit board. The material of the rotor or the stator could be the material of the stator or rotor yoke.

In one embodiment, the circuit board comprises at least two connecting conductor tracks extending from a first peripheral side to a second peripheral side, wherein the first peripheral side is arranged opposed to the second peripheral side, each connecting conductor track has a first connecting terminal at the first peripheral side and a second connecting terminal at the second peripheral side. A connecting conductor track extending from the first to the second peripheral side shall include all types of connecting conductor track which allow a first terminal to be connected to the connecting conductor track on the first peripheral side and/or which allow a second terminal to be connected to the connecting conductor track on the second peripheral side.

This embodiment has the advantage that the circuit board of the winding assembly can be used to provide a connection line from one side of the winding assembly or the device to the other. Especially in micro motors, the size of the motor is very important and a separate connecting wire around the motor would increase the size of the application or complicate the construction. It was found out that the connecting line extending through the motor could be designed so that it does not really disturb the function of the motor and the manufacturing in the circuit board is very easy. The connecting line could connect an electric component, for example a sensor at the tip of a power tool comprising an electric motor, on one side and a power source on the other side. Thus, the first connecting terminals could be connected to the power source (e.g. the net) and the second connecting terminals to the tip of the tool. Other functions for these two connecting conductor tracks are also possible.

This embodiment is particularly advantageous for rolled flexible circuit boards. In some embodiments, the connecting lines are arranged (over most part of the connecting line) parallel to each other. To arrange the connecting lines as close as possible, the connecting lines are arranged at opposing sides of the printed circuit board (at the same height in the movement direction) or on neighbouring circuit board layers at the conductor layers facing each other (at the same height in the movement direction) or next to each other in the same conductor layer of the same circuit board layer. When the connecting lines are arranged very close to each other, the forward and backward currents flowing through the two connecting lines create a magnetic field which almost cancels each other out and thus do not influence the operation of the motor or only slightly. Conversely, the induced voltage in the forward track due to the electromagnetic field generated by the winding conductor tracks is almost cancelled by the induced voltage in the backward track, and thus does not influence the operation of the connecting lines. The connecting conductor tracks could diverge from each other close to the peripheral sides of the circuit board so that the connecting terminals connected to the (diverging portions) are better insulated from each other and/or better accessible. The diverging connecting conductor tracks close to the peripheral side(s) means that their distance (in the movement direction) is increased with respect to their distance in the centre of the circuit board between the two peripheral sides. The position, cross-section parameter like thickness and width and/or the path of the connecting conductor tracks and/or of the connecting terminals can be model parameters such that they are optimized as well.

In one embodiment, the computerized optimization tool or the computer program, instructions, etc., is configured to optimize the electro-mechanical device.

In one embodiment, the winding conductor tracks are configured to conduct the currents operating the electro-mechanical device.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIGS. 4A to 4D show different possible embodiments of the circuit board;

FIGS. 5A to 5C show different possible embodiments of the winding assembly formed by a superposition of the circuit board(s)

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

An electro-mechanical device includes an electric motor, an electric generator, or a combined electromechanical converter. The electric motor converts electric energy into kinetic energy. The electric generator converts kinetic energy into electric energy. The electromechanical converter can work as motor and as generator. In fact, many electric motors today are electromechanical converters capable also to recover energy. If the function of the electro-mechanical device is subsequently described only for the electric motor for the sake of brevity, it shall also behave analogously for the electric generator and the electromechanical converter.

FIGS. 1A to 1E show example embodiments of the electromechanical device. The electro-mechanical device comprises a stator, a rotor, a winding assembly 40 and a magnetic assembly 20. The rotor moves with respect to the stator. The movement of the electro-mechanical device is normally a rotation (rotating device) as shown in the embodiments in FIGS. 1A, 1D and 1E. However, it could also be a translation as in linear motors (more generally linear device) as shown in the embodiments in FIGS. 1B and 1C. In this case, the rotor does not rotate, but translates, i.e. moves along a line. The rotor in this case is sometimes also called mover.

The following description refers to rotating electro-mechanical devices with rotating rotors. However, the disclosure can equally be applied to any linear (also planar or disk) devices and other devices translating rotor movements or combination of those. The rotor and the stator are arranged with a gap 30 in between. The gap 30 can comprise more than one gap 30 as shown in the embodiments in FIGS. 1C and 1E. The gap 30 can be for example on two opposite sides of the rotor, if the stator extends on two sides of the rotor. The gap 30 is normally an air gap 30 filled with air. However, the gap 30 can also be filled with another fluid. The fluid can be a gas or a liquid. The gas is normally air. The liquid could be water. Configurations with multiple rotors, multiple stators, and multiple gaps 30 are also feasible.

Figure 1A:
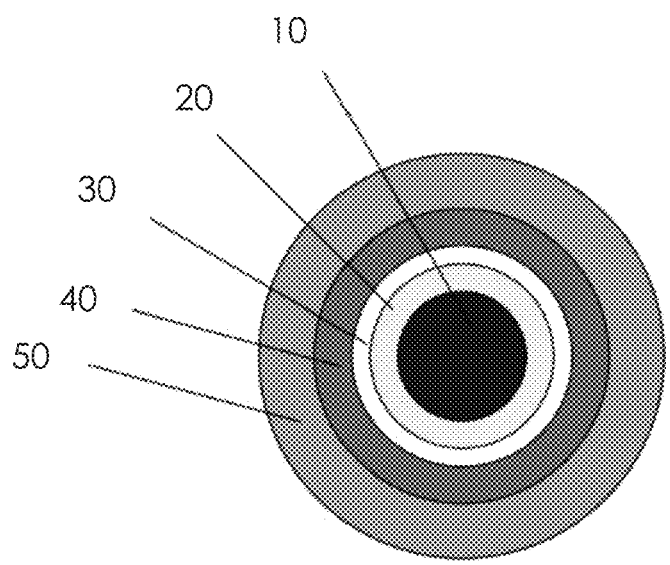
FIG. 1A shows an embodiment of a rotating electric motor with a radial magnetization in a cross-sectional view perpendicular to the radial direction.

In the embodiment of a rotating device, the stator is, for example, arranged around the rotor, i.e. the rotor rotates within the stator, as shown in FIG. 1A. However, it is also possible that the rotor rotates around stator, i.e. that the rotor is arranged around or externally of the stator as shown in FIG. 1E. The stator and the rotor can be arranged cylindrically, at least one of the rotor and the stator being a hollow cylinder including the other within the hollow cylinder as shown in FIGS. 1A and 1E. The rotor and/or the stator can also have a disc shape as shown in FIG. 1D. If the function of the electro-mechanical device is subsequently described only for a winding assembly 40 in a fixed relationship with a stator, the winding assembly 40 can be in a rotating relationship with the stator. The present disclosure can equally be applied to such different configurations.

The electro-mechanical device comprises, for example, three directions. a) A movement direction of the rotor. For a rotating device, the movement direction is an angular direction. b) A rotor direction extending in the direction of the rotation axis of the rotor (for a rotating device) or extending in the direction perpendicular to the movement direction and to the magnetic direction (for all devices). c) A magnetic direction which extends in the main direction of the magnetic field interacting between the winding assembly 40 and the magnetic assembly 20 or between the rotor and the stator. For a rotating device with radial flux, the magnetic direction extends radially to the rotor axis and/or is perpendicular to the movement direction and the rotor direction as shown in FIGS. 1A and 1E. For a rotating device with axial flux, the magnetic direction extends parallel to the rotor axis (axially) and/or is perpendicular to the movement direction and the rotor direction as shown in FIG. 1D. All three directions are, for example, perpendicular to each other. For most components of the electro-mechanical device, a thickness expresses the dimension in the magnetic direction, and/or a length expresses the dimension in the rotor direction.

The stator comprises, for example, a stator yoke 50. The stator yoke 50 has normally the function to block, to channel, and/or to funnel the magnetic fields inside the electro-mechanical device such that the magnetic field outside of the electro-mechanical device is small or reduced and/or to guide and/or to increase the magnetic field of the winding assembly 40 and/or of the magnetic assembly 20 arranged in the stator. The stator yoke 50 may also function to support the winding assembly 40 or the magnetic assembly 20 arranged in the stator. In some embodiments, the stator yoke 50 is made from a metal. The stator yoke 50 is preferably made from a magnetic material, preferably a paramagnetic or ferromagnetic material, even more preferably from a ferromagnetic material. The ferromagnetic material can be a ferromagnetic metal. The dimension(s) and material(s) of the stator yoke 50 are parameters of the stator. The dimension(s) of the stator and/or of the stator yoke 50 preferably comprises a first dimension in the magnetic direction (e.g. the thickness) and a second dimension in the rotor direction (e.g. the length). The dimension could comprise a third dimension in the movement direction, but in most cases, the third dimension is 360°. The (first or second or third) dimension can be expressed in a relative distance (thickness, width, length) or in one or two absolute positions (start and end point in the relevant direction).

The rotor comprises, for example, a rotor yoke 10. The rotor yoke 10 may function to support the winding assembly 40 or the magnetic assembly 20 arranged in the rotor and/or to support the mechanical interface (for a rotating device the axle rotating with the rotor) which transfers the movement energy of the electro-mechanical device. The rotor yoke 10 is made for example out of a metal. The rotor yoke 10 is preferably made from a magnetic material, preferably a paramagnetic or ferromagnetic material, even more preferably out of a magnetic core material. The magnetic materials of the rotor yoke 10 can be arranged (magnetized) in different directions. The dimension(s), material(s), and magnetic arrangements of the materials of the rotor yoke 10 are parameters of the rotor. The dimension(s) of the rotor and/or of the rotor yoke 10 comprises preferably a first dimension in the magnetic direction (e.g. the thickness) and a second dimension in the rotor direction (e.g. the length). The dimension could comprise a third dimension in the movement direction, but in most cases, the third dimension is 360°. The (first or second or third) dimension can be expressed in a relative distance (thickness, width, length) or in one or two absolute positions (start and end point in the relevant direction). In some embodiments, there is no rotor yoke, e.g. in coreless designs.

Optionally, the rotor or stator could comprise a sleeve (sometimes referred as a simple coating) around the magnetic assembly 20 and/or between the magnetic assembly 20 and the gap 30. The rotor sleeve (the sleeve arranged in the rotor) prevents for example that the permanent magnets of the magnetic assembly 20 move due to the centrifugal forces in the stator. The sleeve in the stator or the rotor could further have the function to smooth or protect the surface of the magnetic assembly 20 in the gap 30. The dimension(s) and/or the material(s) of the sleeve could be a further parameter of the rotor or stator (wherever the sleeve is arranged).

The winding assembly 40 comprises at least winding conductors configured to conduct the operating currents of the electro-mechanical device. The operating currents drive or move the rotor, i.e. cause a moving/rotating magnetic field (extending in the magnetic field direction) making the rotor of the motor move (or rotate). The operating currents in a generator are induced by the movement of the rotor of the generator. The winding assembly 40 comprises preferably at least one coil assembly, preferably at least two coil assemblies, preferably at least three coil assemblies. A coil assembly is at least one winding conductor between a winding terminal and another winding terminal or a connection point. A connection point is a point connecting at least three coil assemblies or at least two coil assemblies and one winding terminal.

In some embodiments, the winding assembly 40 comprises at least three coil assemblies connected in a star point or a polygonal connection. In the star point connection, all coil assemblies are connected on one side with a winding terminal (different for each coil assembly) and on the other side with a common connection point (the star point) connecting all of the at least three coil assemblies. In a polygonal connection, all coil assemblies are connected between two connection points, wherein each of the two connection points is connected with a neighbouring coil assembly and a winding terminal.

In some embodiments, the winding assembly 40 comprises three coil assemblies connected in a star point or delta connection (for example for a (brushless) three phase AC device). In some embodiments, the winding assembly 40 comprises at least 3, preferably at least 5, preferably at least 7, preferably at least 9 coil assemblies connected in polygonal connection (for example for a brushed DC device).

In another embodiment, the winding assembly 40 comprises three or more coil assemblies which are connected by one or more star point(s) and/or by a polygonal connection. The winding assembly 40 comprises, for example, at least one phase. In one embodiment, the winding assembly 40 comprises at least two phases, preferably three phases. There are also embodiments possible with more than three phases, e.g. 6 phase or 9 phases. Each phase comprises at least one winding terminal for connecting the winding assembly 40 with a power source (battery, grid or other) for powering the phase of the electric motor for moving the rotor and/or for charging the power source with power from the rotor of the electric generator. The at least one terminal could comprise an input terminal and an output terminal, for example for an embodiment with one phase. The at least one terminal could also comprise (only) one input terminal per phase, while the outputs of the phases are connected in a star point or polygonal connection.

In some embodiments, the winding assembly 40 comprises a circuit board. The circuit board comprises, for example, a substrate and some conductor tracks. There are many possible variants of substrate and this term should therefore be understood in a broad manner. The substrate is preferably adjacent to the conductor tracks and can provide an electrical insulation on one or multiple sides of one or more conductor tracks, including for potentially providing a fully enclosed insulation of the conductor tracks. The substrate may furthermore provide a thermal function and/or provide a mechanical function for bearing the weight of the conductor tracks, keeping them in position, or facilitating its manipulation. This could also support other mechanical elements from the electro-mechanical device, for example the bearing for the rotor. The substrate can be made of different materials such as, but not limited to, plastics, polymer, carbon, film, glue, ceramic, and be handled in an additive, catalytic, formed, or subtractive process.

The winding assembly 40 can be split into multiple sub-assemblies within the electro-mechanical device.

The circuit board comprises, for example, at least one or two conductor layers with conductor tracks. The at least one or two conductor layers are preferably arranged on the two (flat or planar or opposing) sides of the circuit board. The circuit board comprises preferably at least one peripheral side, preferably four peripheral sides connecting the two planar sides. The four peripheral side comprise preferably a first peripheral side, a second peripheral side, a third peripheral side and fourth peripheral side. The first peripheral side is arranged opposed to the second peripheral side. The first peripheral side is preferably parallel to the second peripheral side. The third peripheral side is arranged opposed to the fourth peripheral side. The third peripheral side is preferably parallel to the fourth peripheral side.

The first and/or second peripheral side is preferably longer than the third and/or second peripheral side. The circuit board is preferably a PCB. However, the circuit board could also comprise another kind of circuit board or any other flat substrate with at least one or two conductor layers forming the conductor tracks. Subsequently, the technology is described with a PCB, but could always be replaced by another circuit board.

The conductor tracks comprise winding conductor tracks realizing the winding conductors of the winding assembly 40. The winding conductor tracks are configured to conduct the operating currents of the electro-mechanical device. The winding conductors or the winding conductor tracks are configured to conduct the operating currents driving or moving the rotor, i.e. generating a magnetic field making the rotor of the motor move (or rotate), or are induced by the movement of the rotor of the generator. The (winding) conductor tracks are arranged in the at least two conductor layers of the PCB, for example, the top side and the bottom side of the PCB. The at least two conductor layers could also comprise more conductor layers for more complex PCB designs.

The PCB comprises, for example, connectors for conductively connecting (winding) conductor tracks on different conductor layers. The connectors can alternatively be directly integrated into the conductor tracks. Such connectors are preferably directional interconnect accesses. The PCB (or circuit board) is preferably a flexible PCB (or other flexible circuit board). In a preferred embodiment, the winding assembly 40 is formed by rolling the flexible PCB with the conductor tracks to a hollow cylinder. The flexible PCB is preferably rolled around a rolling axis. The rolling axis is preferably parallel to the rotor axis and/or parallel to the third or fourth peripheral side of the PCB. Preferably, the first and second peripheral sides of the rolled PCB form the base surface of the (hollow) cylinder.

FIGS. 4A-4D shows different circuit board topologies. In FIG. 4A, a first embodiment of the circuit board is shown. The circuit board 1 comprises a substrate 2 with a first layer 5.1 of conductor tracks 3 at the top of the circuit board and a second layer 5.2 of conductor tracks 3 at the bottom of the circuit board. The space between the conductor tracks 3 of the same conductor track layer 5.1 or 5.2 are filled with the substrate 2. Some locations of the conductor tracks 3 in the two layers 5.1 and 5.2 are connected by a connector 4, e.g. a via.

FIG. 4B shows a second embodiment of the circuit board 1 similar to the one in FIG. 4A. However, the space between the conductor tracks of the same conductor track layer 5.1 or 5.2 is not filled with substrate.

FIG. 4C shows a third embodiment of the circuit board 1 similar to the one in FIG. 4A. However, the conductor tracks of the same conductor track layer 5.1 or 5.2 is not open but covered by the substrate 2 or by another protective layer.

FIG. 4D shows a fourth embodiment of the circuit board 1 similar to the one in FIG. 4A. However, the circuit board comprises three (or more) conductor track layers 5.1, 5.2 and 5.3 in the circuit board. Many further embodiments of the circuit board are possible.

The circuit board, the conductor tracks and/or the substrate can be obtained or handled in an additive, catalytic, carving, machined, formed, or a subtractive process or in other forms. If the circuit board is manufactured by additive manufacturing processes such as 3D printing, the substrate between the two conductor layers 5.1 and 5.2 can become very thin and can be individually designed. The connectors and the conductor tracks and the substrate could then be printed in the same printing process layer by layer. This would also allow circuit boards whose conductor layers 5.1, 5.2 are not arranged in one plane, but rather extend three-dimensionally maybe like spaghetti. This could be a way to include more conductor tracks and avoid crossings without special connectors connecting different conductor track layers. Also, the substrate could be designed to have maybe different thicknesses, maybe some air inclusion to reduce weight, etc. Thus, any kind of circuit board produced by new manufacturing methods or produced by classic manufacturing methods. The circuit board with the conductor tracks and the substrate can be manufactured with 3D printing directly in the final form of the winding assembly 40. Thus, the step of manufacturing the circuit board and the step of forming the winding assembly 40 from the circuit board could become one single step.

FIGS. 5A-C shows different embodiments of the winding assembly 40 with different types of superposing different circuit board layers. FIG. 5C shows another embodiment, in which the circuit board is a flexible circuit board which is rolled up to form a cylinder or a hollow cylinder to form the winding assembly 40. Thus, the same circuit board 1 has different portions 1.*i* which form (once rolled up) different circuit board layers 1.*i*.

FIG. 5B show the stacking of different sub circuit boards 1.1, 1.2, 1.3 of the circuit board 1, wherein each sub circuit board 1.1, 1.2, 1.3 forms a different circuit board layer 1.1, 1.2, 1.3. FIG. 5A, shows a winding assembly 40 formed by superposing (three) different sub circuit boards 1.1, 1.2, 1.3. Each sub circuit board 1.1, 1.2, 1.3 has the form of a hollow cylinder. The sub circuit boards 1.1, 1.2, 1.3 are posed one in another (similar like when closing a telescope). Some connections 6 between the sub circuit boards can be present to electrically connect the sub circuit boards. For example, two neighbouring sub-circuit boards could be connected by surface terminal at corresponding positions of the sub-circuit board so that the surface terminals of the sub-circuit board face each other and are in contact (maybe also soldered). The terminals could also be established laterally and then connected by soldering. Many other superpositions of the circuit board are possible.

The winding terminal(s) is/are arranged, for example, at the first peripheral side of the circuit board. In the embodiment of the rolled PCB, the device can be contacted via the winding terminal(s) at the base surface of the cylindrical winding assembly 40.

In some embodiments, the winding assembly 40 comprises at least two superimposed circuit board layers. Different examples of the design of the conductor tracks of the PCB are described in detail in WO2014207174A2 and WO2016110549A1 which are hereby incorporated for the design of the winding conductor tracks and of the winding assembly 40. The superposition of the circuit board layers is achieved, for example, by rolling the flexible circuit board but could also be achieved by other forming of the (flexible) circuit board, e.g. folding, laminating, printing, forming, machining, fusioning or stacking of sub-PCBs, or materials from sub-PCBs. It is however also possible that the PCB is not superimposed and that there is only one circuit board layer.

Parameters of the winding assembly 40 are the dimension(s) of the (formed) winding assembly 40 and the number of superimposed circuit board layers and the parameters of the circuit board. The dimension(s) of the winding assembly 40 could comprise a first dimension of the winding assembly 40 (in the magnetic direction). The first dimension of the winding assembly 40 could be expressed by the relative thickness, the absolute maximum and minimum radii, the number of superimposed PCB layers or the length of the PCB (in the rolling direction). The dimension(s) of the winding assembly 40 could further comprise a second direction of the winding assembly 40 (in the rotor direction), e.g. its length.

The parameters of the circuit board comprise, for example, the parameters of the conductor tracks, the dimension(s) of the circuit board (e.g. thickness of the substrate or the stack-up of the circuit board), the thicknesses of the conductor tracks, the connection of the coil assemblies, the number and shape of distinct conductor tracks, the number of coil assemblies, the number of winding terminals and/or the position of the winding terminals. The thickness in the circuit board refers to the dimension in the direction perpendicular to the circuit board plane.

The parameters of the conductor tracks comprise the 2D or 3D curvature of the conductor tracks, the dimension of any cross-section of the conductor tracks. The dimension(s) of the conductor tracks comprise in particular the dimension of the cross-section of the conductor tracks, e.g. the width of the conductor tracks (perpendicular to the longitudinal axis of the conductor track and parallel to the plane of the circuit board), the distance between the minimum conductor tracks and/or the thickness (in the normal direction of the PCB plane/PCB layers/conductor layers). Materials for conductor tracks can include (but is not limited to) copper, silver, iron, or any metal suitable for passing an electric current, or maintaining the shape of an assembly.

The disclosure is particularly advantageous for flexible circuit boards which are then formed to the winding assembly 40 and/or for superimposed circuit boards, in particular for rolled flexible circuit boards, but also winding assemblies with (hard and/or not superimposed) circuit boards can be optimized by the present disclosure. The electro-mechanical device comprises, for example, a magnetic assembly 20.

In some embodiments, the magnetic assembly 20 comprises at least one magnetic pole, preferably at least one pair of magnetic poles. Each pair of magnetic poles comprises one south pole (in the direction towards the winding assembly 40) and one north pole (in the direction towards the winding assembly 40). The at least one (pair of) magnetic pole(s) can be realized by at least one permanent magnet. The at least one magnetic pole could be also realized by an electromagnet. The magnetic assembly 20 could in this case be realized with one or more conductor tracks similar to the winding assembly 40 for realizing the electromagnet when the conductor tracks conduct a (DC) current. The number of magnetic poles and/or the material(s) of the magnetic assembly 20 are important parameters of the magnetic assembly.

Figure 6A:
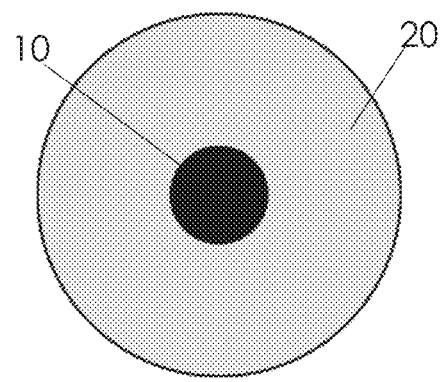
FIGS. 6A to 6E show different possible embodiments of the magnetic assembly in the rotor.
Figure 6B:
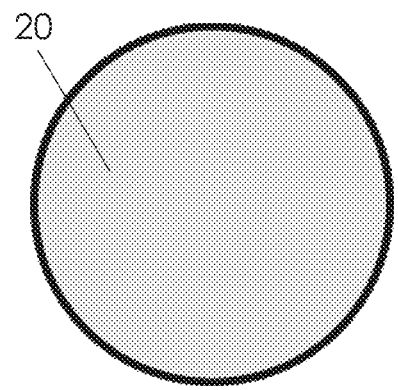
Figure 6C:
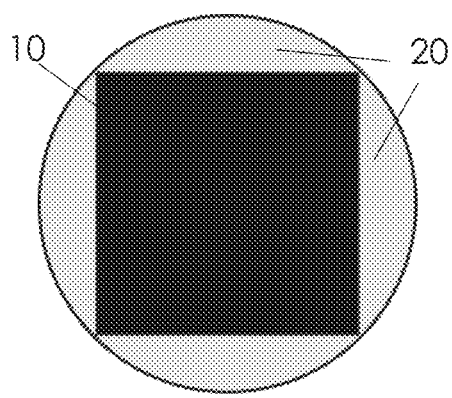
Figure 6D:
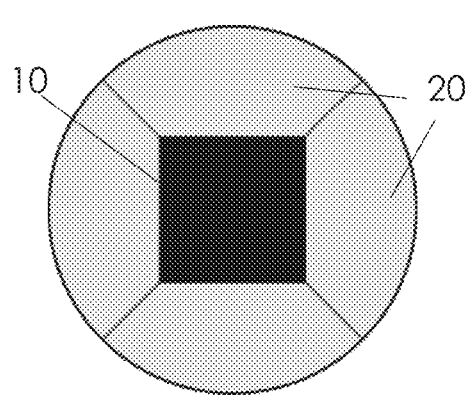
Figure 6E:
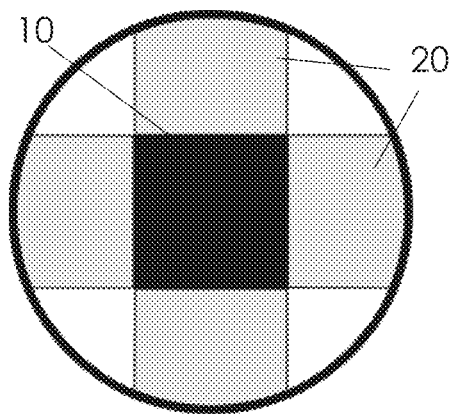

FIGS. 6A-6E show different examples of arranging the magnetic assembly 20 in the rotor. FIG. 6A shows a similar embodiment as shown in FIG. 1A in which the rotor shaft and/or the rotor yoke 10 has a cylindrical form or a circular cross-section. The magnetic assembly 20 has a circular hollow cylinder form or a circular ring cross-section extending around the rotor yoke 10. FIG. 6B shows a core-less rotor, i.e. a rotor with the magnetic assembly 20 without a core or rotor yoke 10. In FIGS. 6C to 6E, the rotor shaft and/or the rotor yoke 10 has a polygonal cross-sectional shape that is a function of the number of magnets in the magnetic assembly (i.e. a square cross-section if there are 4 magnets in the magnetic assembly, a hexagonal cross-section if there are 6 magnets in the magnetic assembly, etc.). The magnetic assembly 20 comprises four sub-assemblies which have bow-shape in FIG. 6C, a trapezoid-shape in FIG. 6D and a bread loaf shape in FIG. 6E. The magnetic assemblies shown in the FIGS. 6A to 6E could also be arranged in a stator, e.g. for a coreless motor. FIG. 6C shows also a hollow rotor shaft and/or rotor yoke.

In some embodiments, the electro-mechanical device comprises a gap 30 between the rotor and the stator. The parameter of the gap 30 is, for example, the distance (in the magnetic direction) between the rotor and the stator. The parameter of the gap 30 could also comprise the material of the gap, i.e. the fluid contained in the gap 30. The fluid is preferably air, the so-called air gap. However, it is also possible to have other gases in the gap 30 or even to have a liquid in the gap 30 like water.

FIGS. 1A-1E show different exemplary embodiments of the electromechanical device.

Figure 1B:
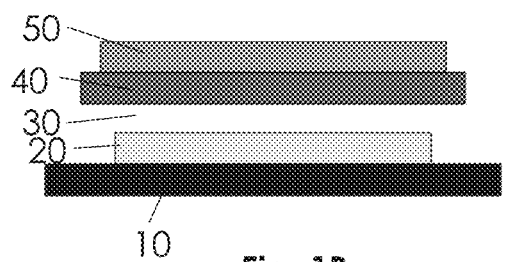
FIG. 1B shows an embodiment of a single-sided linear electric motor.
Figure 1C:
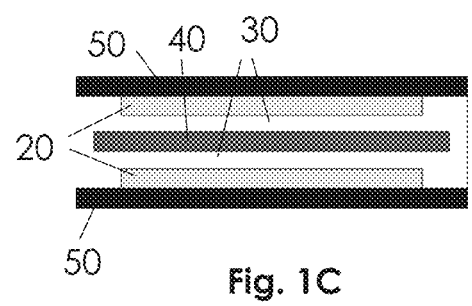
FIG. 1C shows an embodiment of a double-sided linear electric motor
Figure 1D:
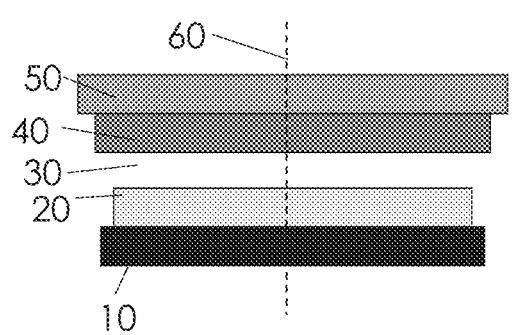
FIG. 1D shows an embodiment of a rotating electric motor with an axial magnetization.
Figure 1E:
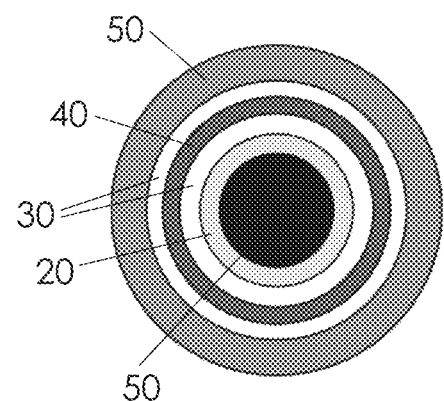
FIG. 1E shows an embodiment of a rotating coreless motor.

In an embodiment, the magnetic assembly 20 is arranged in the rotor and the winding assembly 40 is arranged in the stator as shown in FIGS. 1A, 1B and 1D.

In an alternative embodiment, the magnetic assembly 20 is arranged in the stator and the winding assembly 40 in the rotor as shown for example in FIGS. 1C and 1E. This requires however sliding electrical contact paths which increase the mechanic wear and friction of the machine or a wire connected to the rotor, e.g. in linear machines. This could nevertheless be advantageous for applications with very high dynamics.

A first example of such an electro-mechanical device is shown in FIG. 1A with a rotating rotor. The rotor is arranged within the stator such that the stator surrounds the rotor. The rotor and/or the stator has a cylindrical form with the cylinder axis being the rotation axis and/or the rotor direction. The rotor and the stator are arranged coaxially. The gap 30 is arranged between the stator and the rotor. The rotor comprises a rotor yoke 10 and the magnetic assembly 20. In some embodiments, the magnetic assembly 20 is arranged between the rotor yoke 10 and the gap 30. Optionally, the rotor could comprise a rotor sleeve (not shown in FIG. 1A) as described above. The stator comprises the stator yoke 50 and the winding assembly 40. The winding assembly 40 is, for example, arranged between the stator yoke 50 and the gap 30.

FIG. 1B shows a second example of an electro-mechanical device with a straight translating rotor (or mover), a so called linear electro-mechanical device. The gap 30 is arranged between the stator and the rotor. The rotor comprises a rotor yoke 10 and the magnetic assembly 20. In some embodiments, the magnetic assembly 20 is arranged between the rotor yoke 10 and the gap 30. Optionally, the rotor could comprise a rotor sleeve (not shown in FIG. 1B) as described above. The stator comprises the stator yoke 50 and the winding assembly 40. The winding assembly 40 is preferably arranged between the stator yoke 50 and the gap 30. In this embodiment, the function of the stator and of the rotor could be interchanged easily with a rotor with the rotor yoke 50 and the winding assembly 40 and with a stator with the stator yoke 10 and the magnetic assembly 20.

FIG. 1C shows a third example of an electro-mechanical device with a straight translating rotor, a second example of a linear electro-mechanical device. The device comprises a rotor arranged between the stator which surrounds the rotor on two sides. Thus, the rotor moves in the stator. The stator comprises thus a first stator part on a first side of the rotor and a second stator part on a second side of the rotor. Thus, the gap 30 arranged between the stator and the rotor comprises a first gap 30 between the first stator part and the rotor and a second gap 30 between the second stator part and the rotor. The rotor comprises just the winding assembly 40. The stator comprises the magnetic assembly 20, preferably a first magnetic assembly 20 in the first stator and a second magnetic assembly 20 in the second stator. The stator comprises a stator yoke 50, preferably a first stator yoke 50 in the first stator and a second stator yoke 50 in the second stator. The first magnetic assembly 20 is, for example, arranged between the first stator yoke 50 and the first gap 30. The second magnetic assembly 20 is, for example, arranged between the second stator yoke 50 and the second gap 30. In this embodiment, the function of the stator and of the rotor could be interchanged easily with a rotor with the rotor yoke 50 and the magnetic assembly 20 and with a stator with winding assembly 40. The rotor could have a first rotor arranged on the first side of the stator and a second rotor arranged on the second side of the stator. The first rotor would comprise then the first rotor yoke 50 and the first magnetic assembly 20. The second rotor would comprise then the second rotor yoke 50 and the second magnetic assembly 20.

FIG. 1D shows a fourth example of the electro-mechanical device with a rotor rotating around the rotation axis or rotor axis 60. While FIG. 1A shows a radial flux machine, 1D shows an axial flux machine with the magnetic direction parallel to the rotor direction. The rotor and/or the stator are disc shaped. The disc-plane of the stator and/or the rotor is perpendicular to the rotor direction and/or the rotation axis.

The gap 30 is arranged between the stator and the rotor. The rotor comprises a rotor yoke 10 and the magnetic assembly 20. In some embodiments, the magnetic assembly 20 is arranged between the rotor yoke 10 and the gap 30. Optionally, the rotor could comprise a rotor sleeve (not shown in FIG. 1D) as described above. The stator comprises the stator yoke 50 and the winding assembly 40. The winding assembly 40 is preferably arranged between the stator yoke 50 and the gap 30. In this embodiment, the function of the stator and of the rotor could be easily interchanged with a rotor with the rotor yoke 50 and the winding assembly 40 and with a stator with the stator yoke 10 and the magnetic assembly 20.

FIG. 1E shows a fifth embodiment of the electro-mechanical device with a rotating rotor. It shows a radial flux machine similar to FIG. 1A, but with a coreless design. The rotor and/or the stator has a cylindrical form with the cylinder axis being the rotation axis and/or the rotor direction. The rotor and the stator are arranged coaxially. The rotor comprises the winding assembly 40. The device comprises a rotor arranged between the stator which surrounds the rotor on two sides. The rotor rotates within the stator.

The stator comprises, for example, a first stator on a first side of the rotor and a second stator on a second side of the rotor. Thus, the gap 30 arranged between the stator and the rotor comprises a first gap 30 between the first stator and the rotor and a second gap 30 between the second stator and the rotor. The first stator is arranged inside of the rotor and the second stator is arranged outside of the rotor.

In some embodiments, the first stator has a full cylindrical form. In some embodiments, the second stator has a hollow cylindrical form or the form of a sleeve which is arranged around the first stator. In some embodiments, the rotor has a hollow cylindrical form or the form of a sleeve which is arranged around the first stator and/or within the second stator. In some embodiments, the first stator, the second stator and the rotor are arranged coaxially.

The stator comprises a stator yoke 50, for example, a first stator yoke 50 in the first stator and a second stator yoke 50 in the second stator. The stator comprises the magnetic assembly 20, for example, in the first stator. The first magnetic assembly 20 is, for example, arranged between the first stator yoke 50 and the first gap 30. However, it is also possible to arrange the magnetic assembly 20 in the second stator. In this case, the first stator could be avoided. It would be also possible to arrange a second magnetic assembly in the second stator similar to the embodiment of FIG. 1C.

The electro-mechanical device can be a DC machine, i.e. a DC motor powered by a DC current, or a DC generator transforming the movement of the rotor into a DC current. The electro-mechanical device can also be an AC machine, i.e. an AC motor powered by an AC current, or an AC generator transforming the movement of the rotor into a DC current. The electro-mechanical device can be brushed or brushless. The electro-mechanical device can be cored (with a core or magnetic rotor yoke 10 in the rotor) or coreless (without a core or magnetic rotor yoke 10 in the rotor).

Figure 2:
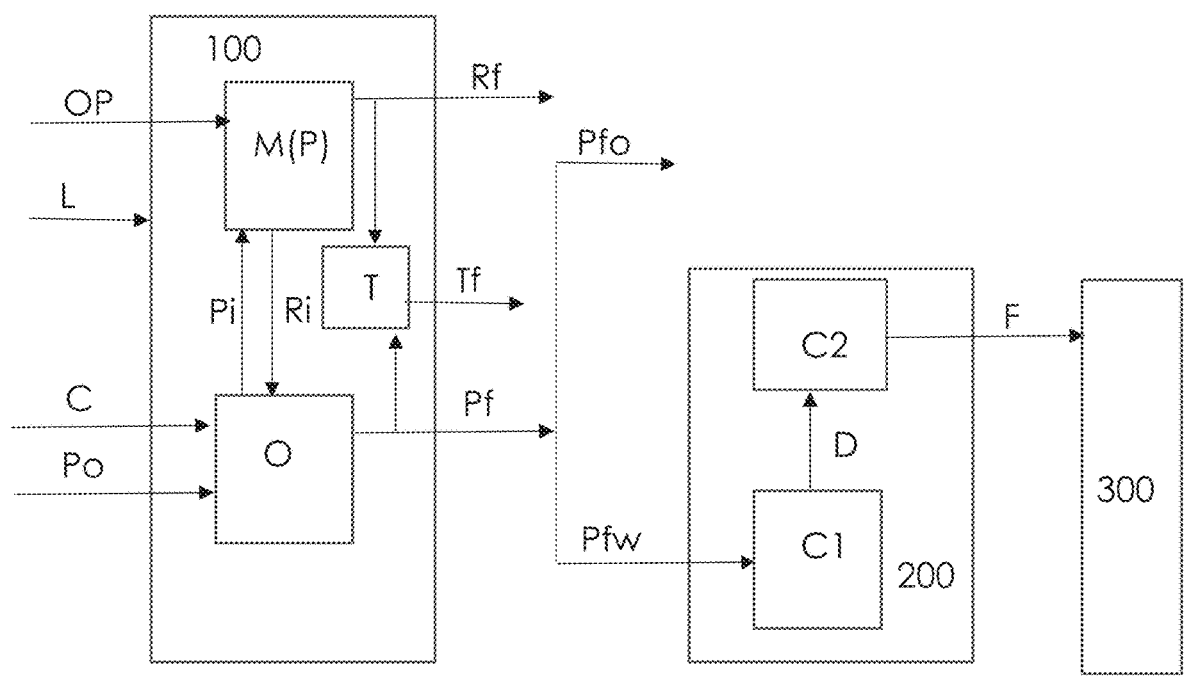
FIG. 2 shows a schematic embodiment of the optimization tool, the conversion tool and the system according to an aspect of the present disclosure.

FIG. 2 shows a computerized optimization tool for developing the design of the electro-mechanical device. In some embodiments, the optimization tool comprises a modelling circuit or means M and an optimization circuit or means O.

The optimization tool receives as input parameters at least one operating parameter OP. The operating parameter OP comprises preferably at least one, preferably two of the motor torque, motor speed, losses of the device and eventually also the temperature of the device. The input parameters comprise preferably at least one value for the at least one operating parameter, e.g. the operating value pair at which the motor is normally operated. It is however also possible that a value range for the at least one operating parameter is given. The value range could be given in combination with a weighting function, which indicates the frequency of the respective values in the value range. This weighted operating value range could also be called operating cycle.

The optimization tool receives, for example, at least one constraint C, a set of initialization values for the model parameters Po and/or a configuration input L as further optional input parameter. The optimization tool receives the input parameters, for example, via a human-machine or a machine-to-machine interface, preferably via a computer user-interface with a screen and/or an input device like a keyboard, a touch sensitive surface, a mouse, etc. Output parameters, including visual representation of data (charts, table . . . ) could also be passed through the same interface. The configuration input L indicates all input parameters relating to the user selection regarding all configurable parameters indicated below.

The modelling circuit or means M is configured to model the electro-mechanical device. The modelling means M comprises, for example, a device model for modelling the electro-mechanical device. The modelling means M and/or the device model is configured to model the electromagnetic behaviour and the mechanical behaviour of the device. The device model can be numerical and/or analytic. In some embodiments, the device model combines numerical and analytic models.

In some embodiments, the model is implemented as computer instructions, that when executed on a processor, computer, etc., carries out one or more methodologies and/or technologies set forth herein, including one or more steps of the methods of claims 1-14. In some embodiments, the computer instructions can be stored in any type of computer-readable medium or computer storage device and be stored on and executed by one or more general purpose computers, thus creating a special purpose computer configured to provide the functionality thereof. In some embodiments, the model can be implemented by one or more circuits, programmable processors, application specific integrated circuits (ASICs), programmable logic devices (PLDs) and/or field programmable logic devices (FPLDs), etc.

The device model is described by a set of model parameters. The set of model parameters comprise parameter(s) of the stator, parameter(s) of the rotor, parameter(s) of the magnetic assembly 20, parameter(s) of the windings assembly and/or parameter(s) of the gap 30 (e.g. as described above). The set of model parameters comprise, for example, at least 5, preferably at least 10, preferably at least 20, preferably at least 30 different model parameters. The values for the set of model parameters may be limited by an allowed model parameter space.

The allowed model parameter space contains all constraints provided by the device itself (not configurable via an input) such as for example that the outer dimension of the rotor must be smaller than the inner dimension of the stator, if the rotor is arranged inside of the stator, etc. The allowed model parameter space of a model parameter could be discrete or continuous. e.g., a value for the thickness of the gap 30 is rather continuous and the value for the stack-up of the circuit board is rather discrete allowing only the stack-ups possible by the provider or the manufacturing machine. The allowed model parameter space can be further limited to a sub-model parameter space by the constraints C input by a user.

A constraint for one model parameter could set this model parameter to a fixed value or could limit the model parameter to a value range or several value ranges. The modelling means M and/or the device model is configured to model the electromagnetic behaviour and the mechanical behavior of the device based on the operating parameters OP and based on the set of values Pi of the model parameters received from the optimizing means O. The modelling means M and/or the device model is configured to determine result values Ri based on the operating parameters OP and the set of values Pi of the model parameters.

If a value range was given for the at least one operating parameter OP, the result values Ri are calculated based on the value range of the at least one operating parameter OP, for example based on a plurality of realization of the value range of the at least on operating parameter. In some embodiments, the result values Ri are computed based on an average, for example based on a weighted average of the result values Ri resulting from the plurality of realizations based on the weighting function received as input parameter. The result values Ri are configured to compute the optimization function described in more detail below. The result value Ri could further be the optimization function itself. In some embodiments, the result values Ri comprise all values needed for evaluating the optimized motor. However, it is also possible that the result values (or resulting values) Ri comprise only the values necessary for computing the optimization function and only in or after the final optimization iteration the remaining result values Rf of interest for the device are calculated to optionally give out the values Rf.

Result values Ri or Rf can be losses, torque, speed, magnetic field, resistance, mechanical friction, aerodynamical friction, size of the motor, weight of the motor, etc. In some embodiments, the optimization tool 100, the modelling means M and/or the device model is configurable for a user to select among different device models each with a different set of model parameters. Different device models could distinguish for example between an AC or a DC device, a brushed or brushless device, a device with the magnetic assembly 20 in the rotor and the winding assembly 40 in the stator or vice versa, etc. In some embodiments, the optimization tool 100, the modelling means M and/or the device model is configurable for a user to select which of the model parameters are optimizable and which parameters are constrained. Preferably, at least 50%, preferably at least 60%, preferably at least 70%, preferably at least 80%, preferably at least 90%, preferably all of the model parameter are optimizable and/or constrainable (by user selection).

The optimization means (or optimizer) O is configured to repeat an optimization process in different optimization cycles i. Preferably, the optimization process is repeated iteratively or recursively. The optimization means O repeats in each optimization cycle i the following process: determine a set of values Pi for the model parameters, send the set of values Pi to the modelling means M, receive the resulting values Ri, calculate an optimization function based on Ri and compare the result of the optimization function with the result of the optimization function with at least one previous optimization cycle.

The details of the optimization cycle is defined in the optimization algorithm. Any standard optimization algorithm or a customized optimization algorithm could be used. In one embodiment, the optimizer O uses a genetic optimization algorithm. In some embodiments, the optimizer using the genetic optimization algorithm uses in each optimization cycle a plurality k of sets of values Pik for the modelling parameters of the i-th cycle. In one embodiment, a deterministic optimization algorithm is used. In some embodiments, the optimization tool 100 or the optimizer O is configurable among different optimization algorithms, for example between a deterministic and a genetic one. The optimization algorithm can perform a search for the values for the parameter that minimize one or several optimization functions. However, an optimization algorithm could be defined which maximizes the optimization function to find the best values.

In some embodiments, the optimization algorithm is implemented as computer instructions, that when executed on a processor, computer, etc., carries out one or more methodologies and/or technologies set forth herein, including one or more steps of the methods of claims 1-14. In some embodiments, the computer instructions can be stored in any type of computer-readable medium or computer storage device and be stored on and executed by one or more general purpose computers, thus creating a special purpose computer configured to provide the functionality thereof. In some embodiments, the model can be implemented by one or more circuits, programmable processors, application specific integrated circuits (ASICs), programmable logic devices (PLDs) and/or field programmable logic devices (FPLDs), etc.

The set of values Pi of the first optimization cycle is either chosen randomly, or based on the set of initialization values, or based on historical values, or based on some other rules stored in the optimizer. The set of values Pi of subsequent optimization cycles are preferably based on the set of values Pi−1 of the previous optimization cycle and/or based on the optimization function of the previous optimization cycle. The set of values Pi can also be selected randomly (e.g. in a genetic optimization algorithm).

The optimizer O receives the resulting values Ri from the modelling means M and calculates the optimization function f(Ri) based on the received results Ri. In a very simple case, the optimization function could be directly a result Ri received from the modelling means M. The optimization function depends preferably on one or more of the following parameters: the Joules losses of the device, unbalanced current losses (of the device subsequently omitted), eddy current losses, the hysteresis losses, the aerodynamical losses, the mechanical losses, the torque or force of the motor, the motor constant kp, volume of the device, the mass of the device, the ripple (oscillations of the torque), costs or sourcing information.

The optimization function can be one of the following embodiments. In one embodiment, the optimization function is defined such that the motor constant kp is maximized. The motor constant kp depends preferably on the motor torque and the losses of the motor, in particular the Joules losses of the motor. In some embodiments, the optimization constant depends on the ratio of the motor torque and a value depending on the losses, for example the square root of the value depending on the losses. The value depending on the losses is preferably the Joules losses. The Joules losses refer to the losses due to the electric resistance in the winding conductors, in particular in the winding conductor tracks.

In one embodiment, the optimization function is defined such that the total losses are minimized. In this case, the motor torque and the motor speed are given preferably as input operating parameters. The total losses comprise preferably one, two, three, more or all of the Joules losses, unbalanced current losses, eddy current losses, the hysteresis losses, the aerodynamical losses and the mechanical losses.

The Eddy currents (also called Foucault's currents) loops of electrical currents (circulating currents) induced within a conductor by a change or a time evolution of the magnetic field in the conductor. Eddy current losses are losses caused by Eddy currents in the device. The Eddy current can appear in the winding conductors and in other conductive parts of the device. The Eddy current losses thus normally comprise the conductor Eddy current losses (caused in the winding conductors) and the remaining Eddy current losses (caused in the other conductive parts of the device).

The unbalanced currents are currents caused by a voltage difference due to different magnetic fields at different parts of a winding conductor, in particular when using a plurality of parallel conductor tracks in a coil assembly. The unbalanced current losses refer to losses of the device caused by unbalanced currents in the winding conductors.

The hysteresis losses refer to hysteresis losses in the ferromagnetic parts, in particular the stator yoke 50 and the rotor yoke 10. The aerodynamical losses refer to the losses of the device causes by the aerodynamical friction caused by the rotor in the gap 30. The mechanical losses refer to the losses caused by the mechanical parts of the device, in particular of the bearings of the rotor and/or of the brushes (if any).

In one optimization function, the optimization function is defined so that the motor torque is optimized for a given total losses amount or temperature. In this case, the total losses or temperature and the motor speed are given preferably as input operating parameters. In one embodiment, the optimization function is defined so that the size and/or weight of the motor is minimized. In this case, the motor torque and the motor speed are given preferably as input operating parameters.

In one embodiment, the optimization function is defined so that the torque per volume density of the torque per mass density of the motor is maximized. In this case, the motor torque and the motor speed are given preferably as input operating parameters. In one embodiment, the optimization function is defined so that the torque oscillations are minimized. In this case, the motor torque and the motor speed are given preferably as input operating parameters. In one embodiment, the optimization function is defined so that the cost(s) of one or more part(s) of an electromechanical device are minimized. In this case, the costs or sourcing information of one or more part(s) of the electromechanical device are given preferably as input operating parameters. Costs may include purchase, manufacturing or labour costs. Sourcing information may include leadtime, supplier information, logistics information, etc.

In one embodiment, the optimization algorithm performs a bi-objective or multi-objective optimization considering two or more optimization functions, preferably two or more of the above-mentioned optimization functions. The optimizer O or the optimization tool 100 is preferably configurable such that a user could select among different optimization functions, preferably among one or more of the above described optimization functions. The optimizer O or the optimization tool 100 is preferably configurable so that a user could select between a mono-objective optimization algorithm based on only one optimization function and a bi-objective optimization algorithm based on at least two optimization functions.

The optimizer O comprises, for example, a stop criterium for stopping the optimization cycle and to give out a final value set Pf of the model parameters. The stop criterium could be for example that (within the last n optimization cycles) the optimization function does not improve any more or improves less than a certain threshold. The stopping criteria could also be a maximum number of cycles. After the optimizer detects the stop criterium, it gives out the final set of values Pf for the model parameters.

The final set of values Pf comprises a first set of values Pfw for the model parameters defining the circuit board (the circuit board parameters) and a second set of values Pfo for the other model parameters. The first set of values Pfw is used to manufacture the circuit board according to the optimization result, while the second set of values Pfo is used to manufacture the other parts of the device according to the optimization result, to form the circuit board according to the optimization result and to assemble the device according to the optimization result.

In a certain embodiment, the optimizer optimizes parameters of the winding assembly 40 and of the remaining device. It was found that the design of the winding assembly 40 highly interacts with the remaining device. By just optimizing the winding assembly 40, the optimization result is limited. By optimizing both together, the performance of the optimized device is significantly improved. However, it would also be possible in another embodiment to optimize only parameters of the winding assembly 40 or the circuit board.

The optimizer O described above uses the device model M defined by the model parameters P (classic parametrical optimizer). The optimizer O could however use also generative design to optimize the design of the electro-mechanical device or of a part of it (generative design optimizer). Instead of a solid cylindrical ring for the rotor yoke 10, a generative design optimization could be used to find the optimal piece for weight, costs and stability. Instead of using a fixed topology for the design of the winding conductor tracks on the circuit board and optimizing the parameters of the topology, generative design could be used to find the optimal topology for the winding conductor tracks.

Generative design means that in a two-dimensional or a three-dimensional location space in the electro-mechanical device or in the rotor or in the stator or in the magnetic assembly 20 or in the winding assembly 40 or in the circuit board, each location point in the location space can be varied in its material or its device function. The device function would be that the location point belongs to the magnetic assembly 20, the winding assembly 40, the gap 30, the rotor yoke 10, the stator yoke 50, the rotor and/or the stator. Thus, generative design does not only optimize the parameters of a fixed topology but is able to optimize the topology by creating new topologies. This could lead to really optimal pieces which are not limited by the constraints of human logic, but just by the electro-mechanical constraints given to the optimizer O. This could be combined with the parametrical optimizer described above such that the optimizer O comprises a parametrical optimizer and a generative optimizer. The two optimizers could be combined by running one or more parametrical optimization cycle(s) of the parametrical optimizer using the generative design from the last generative optimization step/cycle of a generative design optimizer and subsequently by running one or more generative optimization cycle(s) of the generative optimizer using the parametrical design from the last parametrical optimization step/cycle of the generative design optimizer and so on.

The optimization tool 100 comprises, for example, a temperature model T. The temperature model computes the temperature of the electro-mechanical device based on the final set of model parameters Pf and the final resulting values Rf and gives out the temperature Tf of the device. The temperature could be a mean value or could be a temperature field over the device. The temperature model T helps to better understand the temperature of the optimized device. In another embodiment, the temperature model could be part of the modelling means M, if the temperature is a relevant parameter for the optimization function.

The computerized optimization tool 100 in some embodiments is a software, such as executable instructions, executed on a computer, a processor, a chip, etc. The computer could be also a server. The computer, processor, etc., could comprise a plurality of sub-processing devices as in a cloud-computing or in a data processing center. The computerized optimization tool 100 can also be a device, such as a chip, a computer or a dedicated optimizer. The computerized optimization tool 100 can also be a software product storing the software mentioned above.

FIG. 2 shows further a computerized conversion tool 200.

The computerized conversion tool 200 comprises a first converter C1. The computerized conversion tool 200, for example the first converter C1 is configured to convert the optimized design of the winding assembly 40 from the computerized optimization means 100, i.e. the values Pfw of the set of model parameters for the winding assembly 40 or the circuit board, into a design D of the circuit board. The design D of the circuit board includes materials, positions and/or dimensions of (i) the conductor tracks, and/or (ii) connectors connecting the conductor tracks on different conductor layers of the circuit board, and/or (iii) a substrate. The design D of the circuit board, for example the design of the conductor tracks distinguishes from the design of the winding assembly 40, in particular the winding conductor tracks used in the optimizer O.

In the optimizer O, some approximations may be made for the conductors in order to model them more easily and/or in the design of the circuit board D used for manufacturing the circuit board, there are additional constraints, for example from the manufacturing machines of the circuit board.

In some embodiments, the computerized conversion tool 200 comprises a second converter C2. The second converter C2 and/or the computerized conversion tool 200 converts the design of the circuit board into at least one file F readable by at least one manufacturing machine 300 for manufacturing the circuit board.

The circuit board with conductor tracks and/or the connectors according to the optimized design is then manufactured based on the converted design D of the circuit board, preferably is manufactured by the manufacturing machine 300 based on the file F. The file F comprises, for example, a plurality of files, preferably at least one first file defining the materials, positions and/or dimensions of (i) the conductor tracks on the at least two conductor layers and/or at least one second file defining the positions, and/or (ii) the connectors between the at least two conductor layers, and/or (iii) of a substrate. The at least one first file comprises preferably at least two first files, wherein each first file comprises the positions and/or dimensions of the conductor tracks of one conductor layer of the at least two conductor layers. The first files are preferably GERBER files. The at least one second file is preferably a DRILL file. The at least one second file comprises preferably a separate file for each type of connector or via used. In some embodiments, the at least one file F is sent to a manufacturing machine 300 for manufacturing the circuit board according to the optimized design of the winding assembly 40.

In some embodiments, the computerized conversion tool 200 includes a programmed processor, computer, etc. In that regard, the computerized conversion tool 200 may include instructions that when executed by the processor, computer, etc., carries out one or more methodologies and/or technologies set forth herein, including one or more steps of the methods of claims 1-14. In some embodiments, the computer instructions can be stored in any type of computer-readable medium or computer storage device and be stored on and executed by one or more general purpose computers, thus creating a special purpose computer configured to provide the functionality thereof. In some embodiments, the computerized conversion tool 200 can be implemented by one or more circuits, programmable processors, application specific integrated circuits (ASICs), programmable logic devices (PLDs) and/or field programmable logic devices (FPLDs), etc.

In some embodiments, the computerized conversion tool 200 is software, or executable instructions, executed on a computer, a processor, a chip. The computer could be also a server. The computer, processor or chip could comprise a plurality of sub-processing devices as in a cloud-computing or in a data processing center. The computerized conversion tool 200 can also be a device, such as a chip, a computer or a dedicated optimizer. The computerized conversion tool 200 can also be a software or SaaS product storing the software mentioned above. The computerized conversion tool 200 could be the same software as the computerized optimization tool 100 or could be a separate software. In the latter case, the two distinct software could be installed on the same processor or same computer or on different computers or processors.

As described above, the circuit board can be formed to a winding assembly 40 by superposing the circuit board in a number of circuit board layers. This can be realized by a flexible circuit board, a foldable circuit board or a circuit board comprising a number of separate sub-circuit boards. Each circuit board layer corresponds to a different (surface) area of the circuit board. The computerized conversion tool 200 is configured, in some embodiments, to convert the optimized design of the winding assembly 40 into the design of the circuit board so that the distance between conductor tracks in different areas are adapted based on the circuit board layer in which the area is arranged. This consideration might be too complex in the optimization tool 100 and is thus much easier to realize in the conversion tool 200.

In one embodiment, the circuit board is a flexible circuit board, wherein the winding assembly 40 is formed by rolling the manufactured flexible circuit board so that the different areas of the flexible circuit board are superposed at the different circuit board layers with different radiuses. In some embodiments, the optimized design of the winding assembly 40 is converted into the design of the circuit board so that the distance between conductor tracks in different areas are adapted to the radius corresponding to the radius of the circuit board layer corresponding to the respective area so that conductor tracks which are angularly aligned in the optimized design of the winding assembly 40 are also aligned in the winding assembly 40 created by the rolled circuit board. It showed that this small conversion step improves the performance of the optimized device.

In one embodiment, the optimized design of the winding assembly 40 is converted into the design of the circuit board so that the distance between conductor tracks in different areas are adapted based on the circuit board layer such that the conductor tracks follow a defined misalignment in a magnetic direction. This misalignment could be a certain angular misalignment of the conductor tracks of the rolled circuit board compared to the optimized design of the device from the optimization tool 100. Such a misalignment works for example like a filter for electromagnetic noise, e.g. a filter for electromagnetic coherence. The angular misalignment could be to have conductor tracks which are angularly aligned in the optimized design have in the converted design a fixed angular difference from circuit layer to circuit layer.

FIG. 2 shows a system with an optimization tool 100, a conversion tool 200 and a manufacturing machine 300 for manufacturing the circuit board for the winding assembly 40.

The described system and optimization tools enable in a very short time and with no or few human interactions to develop a new electro-mechanical device superior to those in the current art. The developed electro-mechanical devices can be individualized even for small volume application and show a significantly improved performance. The development of the device and the manufacture of the circuit board for the winding assembly 40 can fully or at least in a high degree be automatized such that the development is quick and easy.

Figure 3:
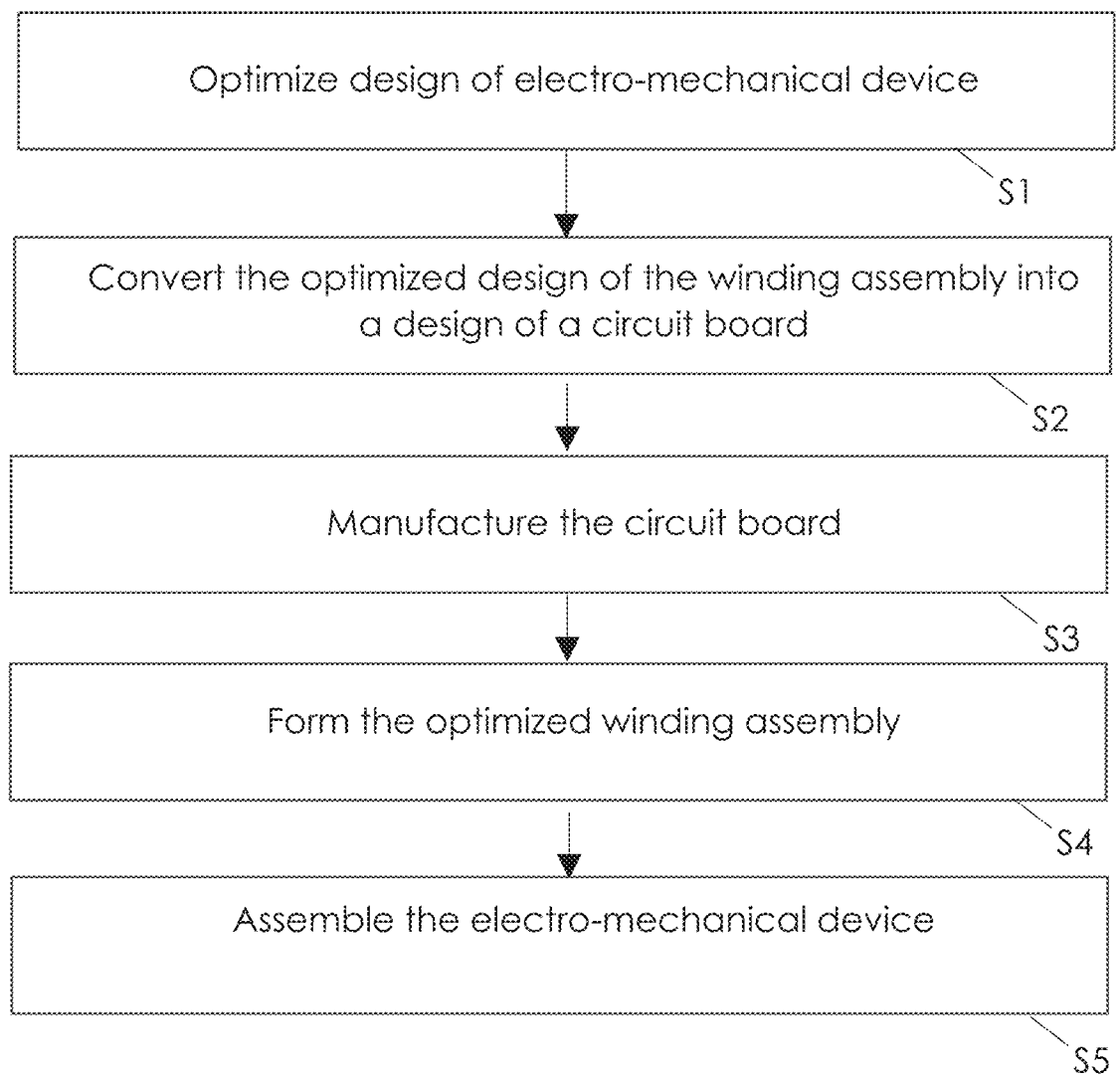
FIG. 3 shows a representative flow chart explaining the major steps of one or more methods of the present disclosure.

FIG. 3 shows a representative method for manufacturing a winding assembly 40 and for manufacturing an electro-mechanical device.

In a first step S1, the design of an electro-mechanical device is optimized with the above-described computerized optimization tool 100. In some embodiments, the input parameters of the optimization tool 100 are input in the computerized optimization tool 100, in particular the operation parameter OP under which the electro-mechanical device shall run. Constraints for the electro-mechanical device can be also defined such as size, maximum temperature, weight, etc. In some embodiments, the optimization tool 100 is configured with the input L, e.g. by selecting the optimization function, the device model, the optimization algorithm, etc. Then, the optimization tool 100 optimizes the electro-mechanical device and outputs the model parameter Pf for the optimized design of the electro-mechanical device.

In step S2, the model parameters Pfw relevant for the circuit board are converted in the above-described conversion tool 200 into a design D of the circuit board, preferably in a file F with the design D which is readable by a manufacturing machine 300 for the circuit board.

In step S3, the circuit board is manufactured based on the optimized design of the winding assembly 40, preferably based on the converted design D of the circuit board, preferably based on the file F.

In step S4, the winding assembly 40 is formed with the manufactured circuit board according to the optimized design of the winding assembly 40 (determined by Pf) from the computerized optimization tool 100. In one embodiment, the manufactured flexible circuit board is rolled to obtain a cylindric winding assembly 40, preferably a hollow-cylindric winding assembly 40. The inner radius, the outer radius and/or the number of circuit board layers of the winding assembly 40 to be formed is defined by the output Pf of the optimization tool. However, other forming processes to obtain the winding assembly 40 from the circuit board are possible. Steps S3 and S4 can eventually be combined into a single step.

The steps S1 to S4 describe a method to develop (or optimize) and manufacture a winding assembly 40.

In step S5, the electro-mechanical device is assembled. This includes the manufacturing as well as the procurement of the remaining pieces of the electro-mechanical device according to the optimized design from the optimization tool 100, like the magnetic assembly 20, the stator (yoke), the rotor (yoke). The winding assembly 40 and the remaining pieces are assembled as foreseen in the device model of the optimization tool 100.

The steps S1 to S5 describe a method to develop (or optimize) and to manufacture an electro-mechanical device.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for producing a winding assembly for an electro-mechanical device, wherein the winding assembly comprises a circuit board with winding conductor tracks configured to conduct the operating currents operating the electro-mechanical device, the method comprising:
  optimizing, in a computerized optimization tool, the design of the winding assembly;
  after optimizing the design of the winding assembly, manufacturing the circuit board with the winding conductor tracks according to the optimized design of the winding assembly; and forming the winding assembly of the electro-mechanical device with the manufactured circuit board,
  wherein
    the design of the winding assembly is optimized in the computerized optimization tool based on at least one of
      an optimization function depending on at least one of eddy current losses outside of the conductor tracks, hysteresis losses, aerodynamical losses and mechanical losses, and a device model which considers at least one of eddy current losses outside of the conductor tracks, hysteresis losses, aerodynamical losses and mechanical losses.

2. The method according to claim 1, wherein the optimization function or the device model depends on two or more of the Joule losses, unbalanced current losses, eddy current losses in the conductor tracks, the eddy current losses outside of the conductor tracks, the hysteresis losses, the aerodynamical losses and the mechanical losses.

3. The method according to claim 2, wherein the optimization function or the device model depends on the eddy current losses in the winding assembly and/or on unbalanced current losses in the winding assembly.

4. A method for producing a winding assembly for an electro-mechanical device, wherein the winding assembly comprises a circuit board with winding conductor tracks configured to conduct the operating currents operating the electro-mechanical device, the method comprising:
  optimizing, in a computerized optimization tool, the design of the winding assembly;
  manufacturing the circuit board with the winding conductor tracks according to the optimized design of the winding assembly; and
  forming the winding assembly of the electro-mechanical device with the manufactured circuit board,
  wherein the design of the winding assembly is optimized in the computerized optimization tool based on at least one of
    an optimization function depending on at least one of Joule losses, unbalanced current losses, eddy current losses in the conductor tracks, eddy current losses outside of the conductor tracks, hysteresis losses, aerodynamical losses and mechanical losses, and
    a device model which considers at least one of Joule losses, unbalanced current losses, eddy current losses in the conductor tracks, eddy current losses outside of the conductor tracks, hysteresis losses, aerodynamical losses and mechanical losses,
  wherein the computerized optimization tool is configured to optimize the design of the winding assembly based on at least one of:
    (i) a directional or dimensional parameter of a cross-section of the conductor tracks;
    (ii) the number of conductor tracks connected in parallel or in series;
    (iii) thickness of one or more of the conductor tracks;
    (iv) a dimension of the winding assembly;
    (v) the superpositions of the circuit board;
    (vi) a directional or dimensional parameter of a cross-section of an optional substrate of the circuit board;
    (vii) the connection of the coil assemblies;
    (viii) the number of coil assemblies;
    (ix) materials of the circuit board or the substrate; and
    (x) the number of winding terminals and the position of the winding terminals.

5. A method for producing a winding assembly for an electro-mechanical device, wherein the winding assembly comprises a circuit board with winding conductor tracks configured to conduct the operating currents operating the electro-mechanical device, the method comprising:
  optimizing, in a computerized optimization tool, the design of the winding assembly;
  manufacturing the circuit board with the winding conductor tracks according to the optimized design of the winding assembly; and
  forming the winding assembly of the electro-mechanical device with the manufactured circuit board,
  wherein the design of the winding assembly is optimized in the computerized optimization tool based on at least one of
    an optimization function depending on at least one of Joule losses, unbalanced current losses, eddy current losses in the conductor tracks, eddy current losses outside of the conductor tracks, hysteresis losses, aerodynamical losses and mechanical losses, and
    a device model which considers at least one of Joule losses, unbalanced current losses, eddy current losses in the conductor tracks, eddy current losses outside of the conductor tracks, hysteresis losses, aerodynamical losses and mechanical losses,
  wherein the method comprises the further step of converting, in a computerized conversion tool, the optimized design of the winding assembly into a design of the circuit board including positions and dimensions of:
    (i) the conductor tracks; and/or
    (ii) the connectors connecting different layers of conductor tracks on the circuit board and/or
    (iii) an substrate wherein the circuit board with conductor tracks for the optimized design of the winding assembly is manufactured based on the converted design of the circuit board.

6. The method according to claim 5 comprising:
  converting, in the computerized conversion tool, the design of the circuit board into at least one file readable by at least one manufacturing machine, and
  sending the at least one file to the at least one manufacturing machine,
  wherein the circuit board with the conductor tracks for the optimized design of the winding assembly is manufactured with the at least one manufacturing machine based on the at least one file.

7. The method according to claim 5, wherein the winding assembly comprises a superposition of a number of circuit board layers, wherein each circuit board layer corresponds to a different area of the circuit board, wherein the optimized design of the winding assembly is converted into the design of the circuit board so that the distances between conductor tracks in different areas are adapted based on the circuit board layer of this area.

8. The method according to claim 7, wherein the optimized design of the winding assembly is converted into the design of the circuit board so that the distance between conductor tracks in different areas are adapted based on the circuit board layer such that the conductor tracks follow a defined misalignment in a magnetic direction.

9. The method according to claim 1, wherein the computerized optimization tool comprises a device model of the electro-mechanical device that models the mechanical behaviour and/or the electromagnetical behaviour of the electro-mechanical device, wherein the model of the electro-mechanical device is defined by a set of model parameters in an allowed model parameter space, wherein the computerized optimization tool is configured to receive at least one operation parameter of the electro-mechanical device, wherein the design of the winding assembly is optimized in the computerized optimization tool by repeating different optimization cycles with different value sets for the set of model parameters, wherein each optimization cycle performs the following steps with a value set for the set of model parameters of the respective optimization cycle:

determining the mechanical behavior and/or the electromagnetical behavior of the electro-mechanical device based on the device model for the at least one operation parameter and for the value set of the actual optimization cycle;

calculating a result of the optimization function based on the determined mechanical behavior and/or the electromechanical behavior; and comparing the result of the optimization function with at least one result of the optimization function of at least one previous optimization cycle, if there is any previous optimization cycle.

10. The method according to claim 9, wherein the computerized optimization tool is configurable such that more than 50% of the model parameter of the set of model parameters of the machine model are configurable model parameters which can be selected among a constraint state and free state, wherein the optimization of each configurable model parameter configured in the constraint state is limited to a sub model parameter space of the allowed model parameter space and the optimization of each configurable model parameter configured in the free state is freely optimizable in the allowed model parameter space, and/or such that the optimization function can be selected among different optimization functions.

11. A method for producing a winding assembly for an electro-mechanical device, wherein the winding assembly comprises w a circuit board with winding conductor tracks configured to conduct the operating currents operating the electro-mechanical device, the method comprising:

optimizing, in a computerized optimization tool, the design of the winding assembly;

manufacturing the circuit board with the winding conductor tracks according to the optimized design of the winding assembly; and forming the winding assembly of the electro-mechanical device with the manufactured circuit board, wherein the design of the winding assembly is optimized in the computerized optimization tool based on at least one of an optimization function depending on at least one of Joule losses, unbalanced current losses, eddy current losses in the conductor tracks, eddy current losses outside of the conductor tracks, hysteresis losses, aerodynamical losses and mechanical losses, and a device model which considers at least one of Joule losses, unbalanced current losses, eddy current losses in the conductor tracks, eddy current losses outside of the conductor tracks, hysteresis losses, aerodynamical losses and mechanical losses, wherein the computerized optimization tool is configured to optimize the winding assembly based on an optimization of at least one material used for the winding assembly.

12. The method according to claim 1, wherein an electro-mechanical device is formed with the formed winding assembly.

13. A method for producing a winding assembly for an electro-mechanical device, wherein the winding assembly comprises a circuit board with winding conductor tracks configured to conduct the operating currents operating the electro-mechanical device, the method comprising:

optimizing, in a computerized optimization tool, the design of the winding assembly;

manufacturing the circuit board with the winding conductor tracks according to the optimized design of the winding assembly; and forming the winding assembly of the electro-mechanical device with the manufactured circuit board, wherein the design of the winding assembly is optimized in the computerized optimization tool based on at least one of an optimization function depending on at least one of Joule losses, unbalanced current losses, eddy current losses in the conductor tracks, eddy current losses outside of the conductor tracks, hysteresis losses, aerodynamical losses and mechanical losses, and a device model which considers at least one of Joule losses, unbalanced current losses, eddy current losses in the conductor tracks, eddy current losses outside of the conductor tracks, hysteresis losses, aerodynamical losses and mechanical losses, wherein the computerized optimization tool is configured to optimize the electro-mechanical device based on a combined optimization of the winding assembly and the design of the remaining electro-mechanical device.

14. The method according to claim 13, wherein the computerized optimization tool is configured to optimize the electromechanical device based on an optimization of at least one material used for the electro-mechanical device.

15. An electro-mechanical device formed by a method according to claim 1.

16. A circuit board or winding assembly produced by a method according to claim 1.

17. A non-transitory computer readable medium having stored thereon executable instructions for developing an optimized electro-mechanical device with a winding assembly formed by a circuit board with conductor tracks, the executable instructions configured, when executed on a computing device, to optimize the design of the winding assembly for the electro-mechanical device, wherein the design of the winding assembly is optimized based on an optimization function depending on at least one of the Joule losses, unbalanced current losses, eddy current losses in the conductor tracks, eddy current losses outside of the winding conductor tracks, hysteresis losses, aerodynamical losses and mechanical losses, wherein a device model of the electro-mechanical device models the mechanical behavior and/or the electromagnetical behavior of the electro-mechanical device, wherein the model of the electro-mechanical device is defined by a set of model parameters in an allowed model parameter space, wherein at least one operation parameter of the electro-mechanical device is received, wherein the design of the winding assembly is optimized in the computerized optimization tool by repeating different optimization cycles with different value sets for the set of model parameters, wherein each optimization cycle performs the following steps with a value set for the set of model parameters of the respective optimization cycle:

determining the mechanical behavior and/or the electromagnetical behavior of the electro-mechanical device based on the device model for the at least one operation parameter and for the value set of the actual optimization cycle;

calculating a result of the optimization function based on the determined mechanical behavior and/or the electromechanical behavior; and comparing the result of the optimization function with at least one result of the optimization function of at least one previous optimization cycle, if there is any previous optimization cycle.

18. The non-transitory computer readable medium according to claim 17, wherein the optimization function or the device model depends on two or more of the Joule losses, unbalanced current losses, eddy current losses in the conductor tracks, the eddy current losses outside of the conductor tracks, the hysteresis losses, the aerodynamical losses and the mechanical losses.

19. The non-transitory computer readable medium according to claim 18, wherein the optimization function or the device model depends on the eddy current losses in the winding assembly and/or on unbalanced current losses in the winding assembly.

20. The non-transitory computer readable medium according to claim 17 comprising the step of converting, in the processor, the optimized design of the winding assembly into a design of the circuit board including positions and dimensions of:

(i) the conductor tracks; and/or
(ii) the connectors connecting different layers of conductor tracks on the circuit board; and/or
(iii) an substrate wherein the circuit board with conductor tracks for the optimized design of the winding assembly is manufactured based on the converted design of the circuit board.

21. The non-transitory computer readable medium according to claim 17, wherein more than 50% of the model parameter of the set of model parameters of the machine model are configurable model parameters which can be selected among a constraint state and free state, wherein the optimization of each configurable model parameter configured in the constraint state is limited to a sub model parameter space of the allowed model parameter space and the optimization of each configurable model parameter configured in the free state is freely optimizable in the allowed model parameter space.

22. The non-transitory computer readable medium according to claim 17, wherein the optimization function can be selected among different optimization functions.

* * * * *